(12) United States Patent
Lee et al.

(10) Patent No.: US 8,377,252 B2
(45) Date of Patent: Feb. 19, 2013

(54) APPARATUS FOR SPRAYING ETCHANT ONTO PRINTED CIRCUIT BOARD

(75) Inventors: Wen-Chin Lee, Taoyuan (TW); Cheng-Hsien Lin, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 1635 days.

(21) Appl. No.: 11/614,362

(22) Filed: Dec. 21, 2006

(65) Prior Publication Data

US 2008/0035603 A1     Feb. 14, 2008

(30) Foreign Application Priority Data

Jul. 28, 2006    (CN) .......................... 2006 1 0061866

(51) Int. Cl.
*H01B 13/00*      (2006.01)
*B44C 1/22*      (2006.01)
*C23F 1/00*      (2006.01)

(52) U.S. Cl. ......... 156/345.21; 156/345.17; 156/345.37; 156/345.2; 156/345.22

(58) Field of Classification Search ................ 156/345.2, 156/345.21, 345.22, 345.37, 349, 345, 345.17
See application file for complete search history.

(56) References Cited

U.S. PATENT DOCUMENTS 3,814,321 A * 6/1974 Mulholland et al. .......... 239/135
2002/0157792 A1* 10/2002 Higa .......................... 156/345.1

FOREIGN PATENT DOCUMENTS

CN       1358406 A     7/2002

* cited by examiner

*Primary Examiner* — Sylvia R. MacArthur
(74) *Attorney, Agent, or Firm* — Altis Law Group, Inc.

(57) ABSTRACT

The present invention relates to an apparatus for spraying an etchant and a method for manufacturing a printed circuit board. In one exemplary embodiment the apparatus includes a manifold, a plurality of feed pipes in fluid communication with the manifold, each of the feed pipes having a plurality of spray nozzles mounted thereon, the feed pipes cooperatively constitute a spray region, and a pressure-boosting device configured for increasing a spray pressure of the spray nozzles which are located at a central area of the spray region. The apparatus can overcome "the puddle effect" on an upper surface of the printed circuit board.

16 Claims, 4 Drawing Sheets

APPARATUS FOR SPRAYING ETCHANT ONTO PRINTED CIRCUIT BOARD

BACKGROUND

1. Technical Field

The present invention relates to an apparatus for spraying an etchant onto a printed circuit board and a method for using such an apparatus to etch a printed circuit board.

2. Discussion of Related Art

Recently, as the electronic appliances are becoming smaller in size and diversified in function, printed circuit boards (PCBs) widely used in such electronic appliances are required to have higher circuit density and reliability.

Usually, a chemical etching process is used for etching a conductive pattern on a copper clad laminate (CCL) as described below. First, a photoresist layer is applied on the CCL by screen printing method. Second, the CCL is driven to pass through an etching bath by a feed roller, thereby an etchant is sprayed simultaneously and evenly onto both an upper surface and a bottom surface of the CCL by a number of spray nozzles. As a result, the copper layer uncovered by the photoresist layer is etched and a conductive pattern is formed on the copper layer.

This chemical etching process is both cheap and can involve a high level of automation. However, chemical etching also suffers from a problem known as "the puddle effect". Specifically, "the puddle effect" is due to different refresh rates of etchant between a peripheral area and a central area of the CCL being sprayed, i.e., the refresh rate of etchant in peripheral area is higher than that in central area due to the formation of a puddle of etchant in a central area of the CCL during spraying process. Thus, "the puddle effect" causes different etching speeds between peripheral areas and central areas of an upper surface of the CCL. As a result, the peripheral areas are etched more deeply than the central areas.

Therefore, there is a desire to develop a new apparatus and method for etching a printed circuit board that can overcome the "the puddle effect".

SUMMARY

This and other features and advantages of the present invention as well as the preferred embodiments thereof and a metal nanowire array and techniques for fabricating metal nanowire array in accordance with the invention will become apparent from the following detailed description and the descriptions of the drawings.

In one embodiment, an apparatus for spraying an etchant includes a manifold, a plurality of feed pipes in fluid communication with the manifold, each of the feed pipes having a number of spray nozzles mounted thereon, the feed pipes cooperatively constitute a spray region, and a pressure-boosting device configured for increasing a spray pressure of the spray nozzles which are located in a central area of the spray region.

In another embodiment, a method for etching a printed circuit board includes the steps of: providing an apparatus as described above; spraying an etchant onto the printed circuit board from the spray nozzles, wherein a spray pressure of the spray nozzles is regulated in a manner such that the spray pressure of the spray nozzles spatially corresponding to a central area of the printed circuit board is greater than that of the spray nozzles spatially corresponding to a peripheral area of the printed circuit board.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention.

DETAILED DESCRIPTION OF THE PREFERRED EMBODIMENTS

Figure 1:
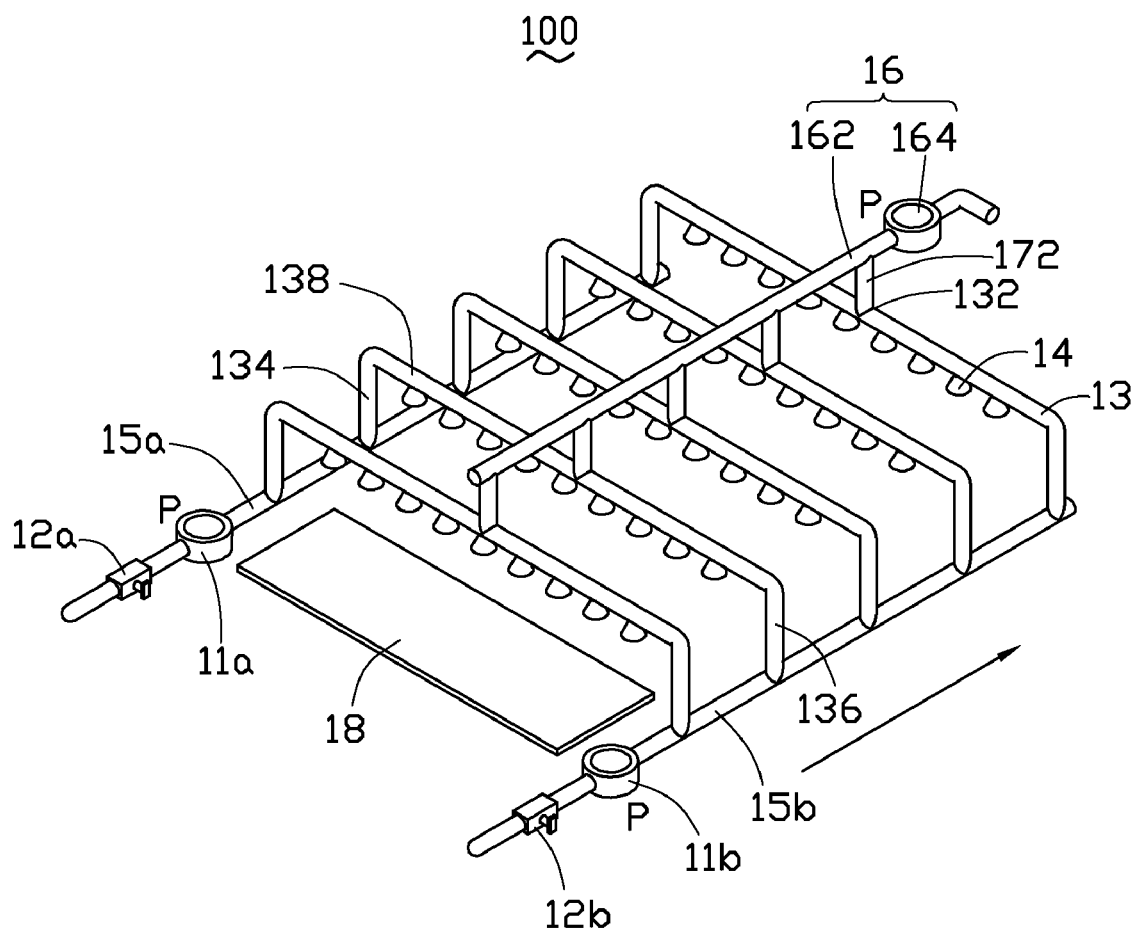
FIG. 1 is a schematic view of an apparatus for spraying an etchant in accordance with the first embodiment.

Referring to FIG. 1, an apparatus 100 for spraying an etchant onto a printed circuit board in accordance with the first embodiment includes pumps 11a, 11b, valves 12a, 12b, manifolds 15a, 15b, a number of feed pipes 13 and a pressure-boosting device 16. The pump 11a and the valve 12a are mounted on the manifold 15a. The pump 11b and the valve 15b are mounted on the manifold 15b. The manifolds 15a, 15b are configured for supplying the etchant. The valves 12a, 12b are used for regulating a flow of the etchant in the manifolds 15a, 15b, respectively. The feed pipes 13 are arranged parallel to each other and spaced an equal interval from each other. In other words, the feed pipes 13 are equidistantly arranged. The feed pipes 13 cooperatively constitute (define) a spray region. Two ends of each of the feed pipes 13 are in fluid communication with the manifolds 15a, 15b, respectively. Each of the feed pipes 13 is provided with a number of spray nozzles 14 for spraying. The spray nozzles 14 mounted on each feed pipe 13 are arranged substantially along a straight line. In the preferred embodiment, the pressure-boosting device 16 includes a pressure-boosting pipe 162 and a pressure-boosting pump 164 mounted on the pressure-boosting pipe 162. The pressure-boosting pipe 162 is in fluid communication with each of the feed pipes 13 at a central portion 132 of each of the feed pipes 13. The pressure-boosting pump 164 is provided to supply additional etchant at high pressure into each of the feed pipes 13 through the pressure-boosting pipe 162, thereby improving a spray pressure of the spray nozzles 14 mounted adjacent to the central portion 132 of each of the feed pipes 13. That is, the pressure-boosting pump 164 is configured for supplying additional etchant which has a pressure higher than that of the etchant in the manifolds 15a, 15b. The pressure-boosting device 16 is also configured for increasing spray pressure of the spray nozzles 14 which are adjacent to the pressure-boosting device 16. In other words, the pressure-boosting 16 is configured for increasing spray pressure of the spray nozzles 14 which are located in an intermediate portion of the spray region.

As shown in FIG. 1, the apparatus 100 is used for etching a printed circuit board 18. An etchant is sprayed onto an upper surface of the printed circuit board 18. Generally, the etchant can include a cuprous chloride solution, but other etchants such as ferric trichloride solution can also be used. Because the spray pressure in the section near to the central portion 132 of each of the feed pipes 13 is higher than that in the section remote from the central portion 132, the spray speed of the etchant in the section near the central portion 132 is improved, thus improving a replenishment rate of the etchant in the central area of the printed circuit board 18. In other words, the etching speed of the central area of the printed circuit board 18 and that of the peripheral area of the printed circuit board 18 should be roughly identical.

Specifically, pressure at the central portion 132 of each feed pipe 13 (hereinafter simply referred to as "central pressure") should be 5% to 20% higher than pressure at two ends of each feed pipe 13 (hereinafter simply referred to as "end pressure"). For example, if the central pressure is 2 kilograms of force per square centimeter ($kgf/cm^2$), the end pressure can be in the approximate range from 1.6 $kgf/cm^2$ to 1.9 $kgf/cm^2$. The central pressure can be controlled using the pressure-boosting pump 164 and the end pressure can be controlled using the pumps 11a, 11b.

Preferably, an oxidant gas such as oxygen or air can be pumped into the pressure-boosting pipe 162. The oxidant gas can also improve etching speed in the central area of the printed circuit board 18. First, the oxidant gas improves etchant reactivity. Second, bubbles formed by the oxidant gas forms a number of overfalls (i.e., temporarily shielded surface areas) in the puddle on the central area thereby improving a replenishment rate of the etchant in the central area of the printed circuit board 18.

Figure 2:
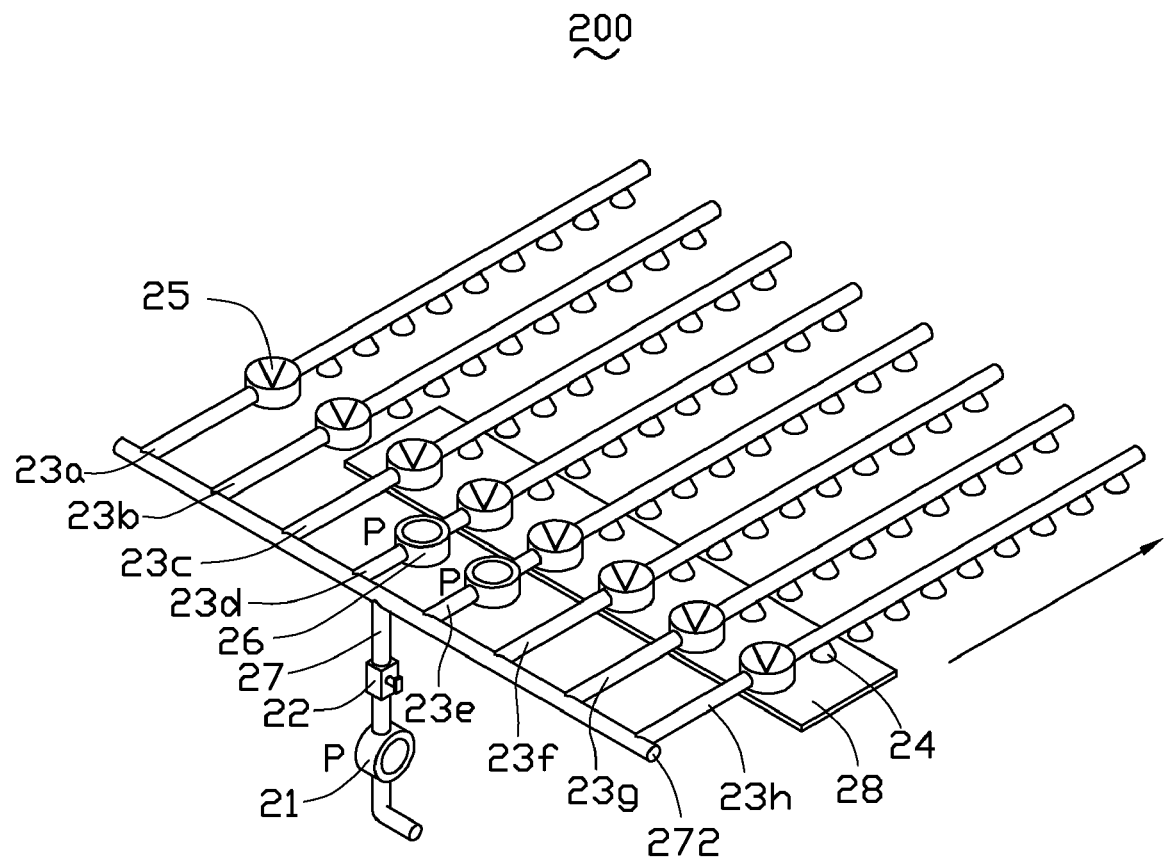
FIG. 2 is a schematic view of an apparatus for spraying an etchant in accordance with the second embodiment.

Referring to FIG. 2, an apparatus 200 for spraying an etchant in accordance with the second embodiment includes a pump 21, a valve 22 and a plurality of feed pipes 23a, 23b, 23c, 23d, 23e, 23f, 23g, 23h. The pump 21 supplies the etchant to each of the feed pipes 23a, 23b, 23c, 23d, 23e, 23f, 23g, 23h through a manifold 27. In other words, the feed pipes 23a, 23b, 23c, 23d, 23e, 23f, 23g, 23h are each in fluid communication with the manifold 27, and the manifold 27 conveys the etchant to the feed pipes 23a, 23b, 23c, 23d, 23e, 23f, 23g, 23h. The feed pipes 23a, 23b, 23c, 23d, 23e, 23f, 23g, 23h are substantially parallel to each other, disposed at equal intervals, and cooperatively constitute (define) a spray region. Each feed pipe 23a, 23b, 23c, 23d, 23e, 23f, 23g, 23h has a plurality of spray nozzles 24 and a mass flow controller (MFC) 25 mounted thereon. The MFC 25 is adjacent to the manifold 27, and the spray nozzles 24 are substantially arranged along a line and are positioned away from the manifold 27. The feed pipes 23a, 23b, 23c, 23d, 23e, 23f, 23g, 23h are arranged in sequence, and include a first group of feed pipes 23d, 23e, a second group of feed pipes 23a, 23b, 23c, and a third group of feed pipes 23f, 23g, 23h. The first group of feed pipes 23d, 23e are located between the second group of feed pipes 23a, 23b, 23c and the third group of feed pipes 23f, 23g, 23h. A pressure-boosting pump 26 is mounted on each of the first group of feed pipes 23d, 23e. The pressure-boosting pump 26 is configured for improving a spray pressure in each of the first group of feed pipes 23d, 23e. That is, the pressure-boosting pumps 26 are configured for increasing the spray pressure of the spray nozzles 24 which are mounted on the first group of feed pipes 23d, 23e. In other words, the pressure-boosting pumps 26 are configured for increasing the spray pressure of the spray nozzles 24 which are located in an intermediate portion of the spray region.

When a printed circuit board 28 is etched with the apparatus 200, the printed circuit board 28 is conveyed by a feed roller (not shown) in a direction that is parallel to the feed pipes 23a, 23b, 23c, 23d, 23e, 23f, 23g, 23h or at a certain angle with respect to the feed pipes 23a, 23b, 23c, 23d, 23e, 23f, 23g, 23h. Because the spray pressure in the feed pipes 23d, 23e is higher than that in the feed pipes 23a, 23b, 23c, 23f, 23g, 23h, specifically, the spray pressure in the feed pipes 23d, 23e can be proportionally higher than the spray pressure in the feed pipes 23a, 23b, 23c, 23f, 23g, 23h by an amount in the range from 5% to 20%, thus improving a replenishment rate of the etchant in the central area of the printed circuit board 28. In other words, the etching speed of the central area of the printed circuit board 28 and that of the peripheral area of the printed circuit board 28 become roughly equal.

Additionally, spray pressure in each of the feed pipes 23a, 23b, 23c, 23f, 23g, 23h can be controlled by a corresponding MFC in such a manner that spray pressure in each of the feed pipes 23e, 23f, 23g, 23h is 5%-20% less than spray pressure in each of the feed pipes 23d, 23c, 23b.

Figure 3:
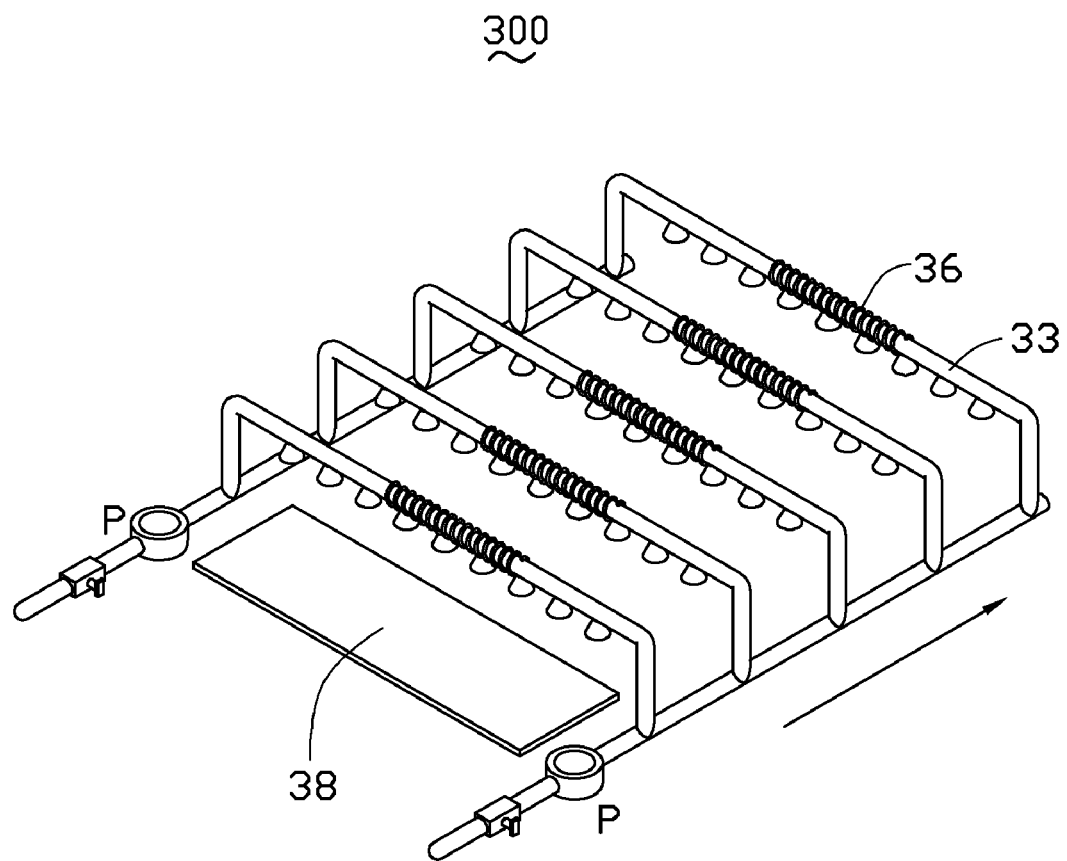
FIG. 3 is a schematic view of an apparatus for spraying an etchant in accordance with the third embodiment.

Referring to FIG. 3, an apparatus 300 in accordance with the third embodiment is similar to that of the first embodiment except that a pressure-boosting device includes a number of heating apparatuses 36. Each of the heating apparatuses 36 surrounds a corresponding feed pipe 33 at a central section of the feed pipe 33. In the preferred embodiment, the heating apparatuses 36 are resistance coils. The heating apparatuses 36 heat the etchant in the feed pipe 33, the etchant expands such that the pressure thereof is increased, and as a result a replenishment rate of the etchant in the central area of a printed circuit board 38 is also improved. Furthermore, the etching reaction is also accelerated by the increased temperature of the etchant. In other words, the etching speed of the central area of the printed circuit board 38 and that of the peripheral area of the printed circuit board 38 become roughly equal.

Figure 4:
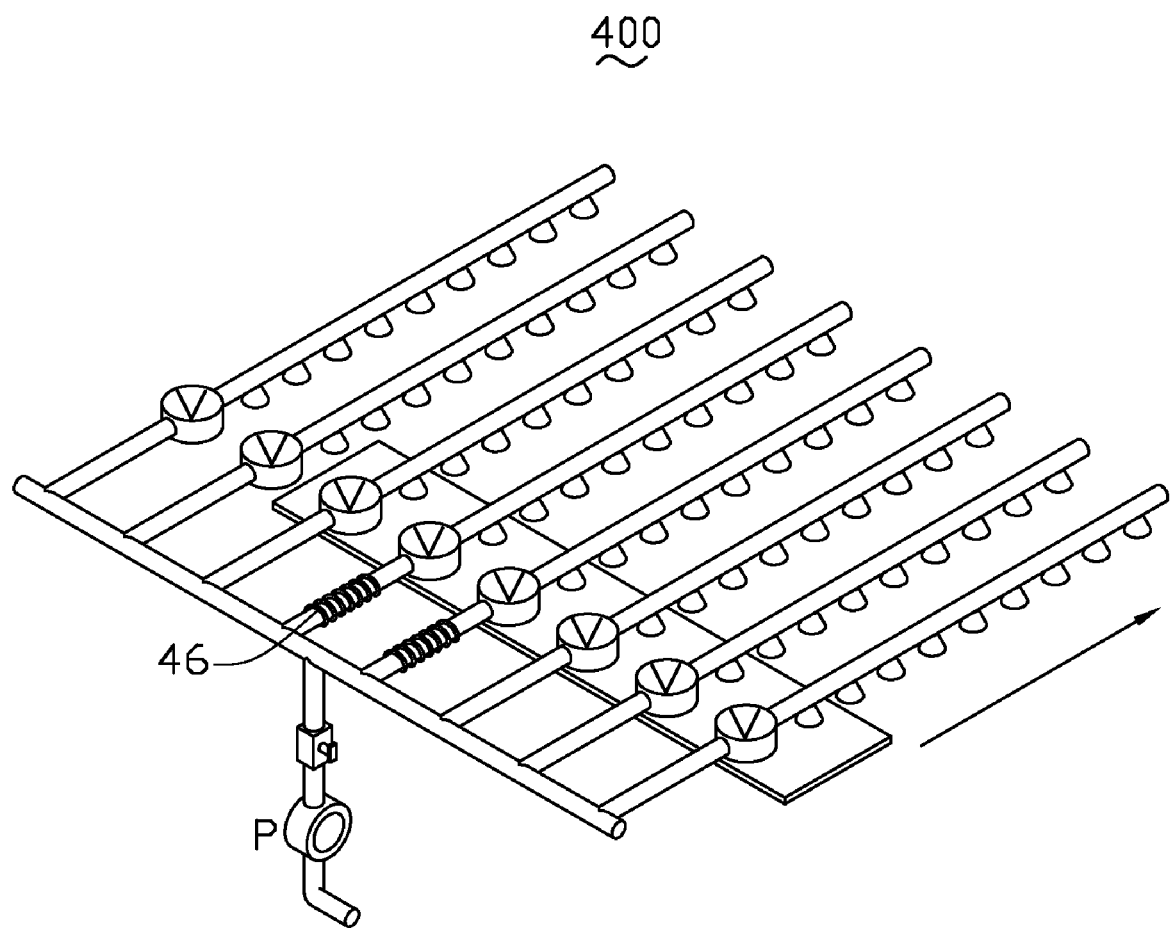
FIG. 4 is a schematic view of an apparatus for spraying an etchant in accordance with the fourth embodiment.

Referring to FIG. 4, an apparatus 400 in accordance with the fourth embodiment is similar to that of the second embodiment except that each pressure-boosting pump 26 is replaced with a heating apparatus 46. The heating apparatuses 46 and their effect are similar to those of the third embodiment.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. An apparatus for spraying an etchant, the apparatus comprising:
    two manifolds generally parallel to each other,
    two first pumps mounted on the two manifolds, respectively,
    a plurality of feed pipes in fluid communication with both of the manifolds in such a manner that one end of each of the feed pipes is connected with one manifold and the other end of each of the feed pipes is connected with the other manifold, each of the feed pipes having a plurality of spray nozzles mounted thereon, the feed pipes cooperatively constituting a spray region, some of the spray nozzles located at a central area of the spray region, and other of the spray nozzles located at portions of the spray region outside of the central area, and
    a pressure-boosting device mounted on each of the feed pipes and configured for increasing spray pressure of the spray nozzles which are located in the central area of the spray region.

2. The apparatus as claimed in claim 1, wherein the pressure-boosting device comprises a pressure-boosting pipe and a second pump mounted on the pressure-boosting pipe, the pressure-boosting pipe being substantially perpendicular to each of the feed pipes and in fluid communication with a central portion of each of the feed pipes via a plurality of diverting pipes, each of which interconnects the central portion of a respective feed pipe and the pressure-boosting pipe.

3. The apparatus as claimed in claim 1, wherein the pressure-boosting device comprises a plurality of heating apparatuses each surrounding a central portion of a respective one of the feed pipes for heating the central portion of each of the feed pipes.

4. The apparatus as claimed in claim 3, wherein the plurality of heating apparatuses are a plurality of resistance coils.

5. The apparatus as claimed in claim 1, wherein the feed pipes are parallel to each other, and the manifolds are generally perpendicular to the feed pipes.

6. The apparatus as claimed in claim 5, wherein each of the feed pipes includes a first portion, a second portion generally parallel to the first portion, and a third portion interconnecting the first and the second portions, the first and the second portions are connected with the two manifolds, respectively, and the pressure-boosting device is above the third portion of each of the feed pipes.

7. The apparatus as claimed in claim 6, wherein the pressure-boosting device comprises a pressure-boosting pipe and a second pump mounted on the pressure-boosting pipe, the apparatus further comprises a plurality of diverting pipes each interconnecting a central portion of the third portion of a respective feed pipe and the pressure-boosting pipe, and, as such, the pressure-boosting pipe is in fluid communication with each of the feed pipes.

8. The apparatus as claimed in claim 6, wherein the pressure-boosting device comprises a plurality of resistance coils each surrounding a central portion of the third portion of a respective feed pipe.

9. An apparatus for spraying an etchant, the apparatus comprising:
   two manifolds generally parallel to each other;
   a plurality of feed pipes generally perpendicular to and in fluid communication with both of the manifolds, each of the feed pipes including a first portion connected with one manifold, a second portion connected with the other manifold, and a third portion interconnecting the first and the second portions, a plurality of spray nozzles being mounted on the third portion of each of the feed pipes;
   a pressure-boosting device above the feed pipes, the pressure-boosting device comprising a pressure-boosting pipe generally parallel to the manifolds and a pump mounted on the pressure-boosting pipe; and
   a plurality of diverting pipes interconnecting the pressure-boosting device and the feed pipes in such a manner that one end of each of the diverting pipes is connected with the pressure-boosting pipe and the other end of each of the diverting pipes is connected with a central portion of the third portion of a respective feed pipe, the pressure-boosting pipe being configured for increasing spray pressure of the spray nozzles which are located adjacent to the central portions of the third portions of the feed pipes.

10. The apparatus as claimed in claim 9, wherein both of the manifolds have a pump mounted thereon.

11. The apparatus as claimed in claim 10, wherein both of the manifolds have a valve mounted thereon.

12. The apparatus as claimed in claim 9, wherein the diverting pipes are generally perpendicular to the third portions of the feed pipes.

13. An apparatus for spraying an etchant onto a printed circuit board, the apparatus comprising:
   a manifold configured for supplying the etchant,
   a pump and a valve mounted on the manifold,
   a plurality of feed pipes arranged substantially parallel to each other, each feed pipe having a plurality of spray nozzles mounted thereon, wherein the feed pipes cooperatively define a spray region and include a first group of feed pipes fewer in number than the plurality of feed pipes, the first group of feed pipes located in an intermediate portion of the spray region,
   a connecting pipe interconnecting the manifold and each of the feed pipes, whereby each feed pipe is in fluid communication with the manifold,
   a plurality of mass flow controllers mounted on the plurality of feed pipes, respectively, and
   a pressure-boosting device mounted on each of the feed pipes of the first group of feed pipes, the pressure-boosting device being arranged between the connecting pipe and the mass flow controllers, the pressure-boosting device being configured for increasing spray pressure of the spray nozzles which are mounted on the first group of feed pipes.

14. The apparatus as claimed in claim 13, wherein the pressure-boosting device comprises a plurality of pressure-boosting pumps each mounted on one of the feed pipes of the first group of feed pipes.

15. The apparatus as claimed in claim 13, wherein the pressure-boosting device comprises a plurality of heating apparatuses each surrounding one of the feed pipes of the first group of feed pipes.

16. The apparatus as claimed in claim 13, wherein the plurality of feed pipes further comprises a second group of feed pipes and a third group of feed pipes, the first group of feed pipes is located between the second and the third groups of feed pipes, and no pressure-boosting device mounted on any one of the feed pipes of the second and the third groups of feed pipes.

* * * * *